US012696718B2

(12) United States Patent
Savard et al.

(10) Patent No.: US 12,696,718 B2
(45) Date of Patent: Jul. 28, 2026

(54) CARRIER FOR SECURING FABRICATED WAFERS

(71) Applicant: Ciena Corporation, Hanover, MD (US)

(72) Inventors: Simon Savard, Quebec (CA); Raphael Beaupré-Laflamme, Quebec (CA); François Pelletier, Quebec (CA)

(73) Assignee: Ciena Corporation, Hanover, MD (US)

( * ) Notice: Subject to any disclaimer, the term of this patent is extended or adjusted under 35 U.S.C. 154(b) by 701 days.

(21) Appl. No.: 18/301,291

(22) Filed: Apr. 17, 2023

(65) Prior Publication Data

US 2024/0242990 A1      Jul. 18, 2024

Related U.S. Application Data

(60) Provisional application No. 63/439,696, filed on Jan. 18, 2023.

(51) Int. Cl.
| | |
|---|---|
| *H10P 72/00* | (2026.01) |
| *B25B 11/00* | (2006.01) |
| *H10P 72/10* | (2026.01) |
| *H10P 72/78* | (2026.01) |

(52) U.S. Cl.
CPC ............ *H10P 72/18* (2026.01); *B25B 11/005* (2013.01); *H10P 72/78* (2026.01)

(58) Field of Classification Search
CPC .......... B25B 11/00; B25B 11/02; H10P 72/00; H10P 72/127
See application file for complete search history.

(56) References Cited

U.S. PATENT DOCUMENTS

| | | | |
|---|---|---|---|
| 6,672,576 B1 * | 1/2004 | Walker | B23Q 3/088 |
| | | | 269/21 |
| 7,448,606 B1 * | 11/2008 | Johnson | B05B 13/0285 |
| | | | 269/16 |
| 7,866,641 B1 * | 1/2011 | Switzer | B23Q 1/0018 |
| | | | 269/309 |
| 9,147,593 B2 * | 9/2015 | Lach | H10P 72/7608 |
| 9,159,595 B2 | 10/2015 | Hurley et al. | |

(Continued)

OTHER PUBLICATIONS

Boyer et al., "Novel, high-throughput, fiber-to-chip assembly employing only off-the-shelf components", 2017 IEEE 67th Electronic Components and Technology Conference, pp. 1632-1639.

(Continued)

*Primary Examiner* — Lee D Wilson
(74) *Attorney, Agent, or Firm* — Young Basile Hanlon & MacFarlane, P.C.

(57)      ABSTRACT

An apparatus for securing a wafer, the wafer having a first side comprising a plurality of fabricated structure regions and a second side that has at least one region that is exposed for fabrication when the wafer is secured, comprises: a carrier base configured to receive the wafer, the carrier base comprising one or more alignment features for aligning the wafer to the carrier base; and a plurality of support structures arranged on the carrier base. Three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

20 Claims, 11 Drawing Sheets

(56) References Cited

U.S. PATENT DOCUMENTS

| 11,237,344 | B2 | | 2/2022 | Vermeulen et al. | |
| 11,524,392 | B2 | * | 12/2022 | Ahamed | B25B 11/005 |
| 12,220,730 | B2 | * | 2/2025 | Li | B08B 11/02 |
| 2022/0362947 | A1 | | 11/2022 | Beaupré-Laflamme et al. | |

OTHER PUBLICATIONS

Liang et al., "Precise, High-Throughput Underfill Dispense In Chip-On-Wafer Packaging", Global SMT & Packaging, Jul. 12, 2017, pp. 11-13.

* cited by examiner

Carrier base
502

Carrier base
502

Carrier base 522B

524

526B

Carrier base 522A

506

526A

524

CARRIER FOR SECURING FABRICATED WAFERS

CROSS-REFERENCE TO RELATED APPLICATION(S)

This application claims priority to and the benefit of U.S. Provisional Application Patent Ser. No. 63/439,696, entitled "CARRIER FOR SECURING FABRICATED WAFERS," filed Jan. 18, 2023, the entire disclosure of which is hereby incorporated by reference.

TECHNICAL FIELD

This disclosure relates to a carrier for securing fabricated wafers.

BACKGROUND

Integration of various integrated circuits can be made at the wafer-level using chip-on-wafer (COW) processes. In some cases, such processes can be performed using a flat carrier if the wafer has a flat surface on which to sit during the various assembly steps. In some cases, one side of the wafer is undergoing processing but there are regions in which there are fabricated structures on the opposite side of the wafer, such as from back-end-of-line (BEOL) fabrication, in which case techniques can be used such as thick and compliant backside grinding tape or hot wax mounting methods. Backside grinding tape may require so much force and effort for debonding that it is not compatible with a relatively fragile wafer. There may be some high temperature processes that cannot accommodate wafer topography on the opposite side of the wafer when typical carriers are used.

SUMMARY

In one aspect, in general, an apparatus for securing a wafer, the wafer having a first side comprising a plurality of fabricated structure regions and a second side that has at least one region that is exposed for fabrication when the wafer is secured, comprises: a carrier base configured to receive the wafer, the carrier base comprising one or more alignment features for aligning the wafer to the carrier base; and a plurality of support structures arranged on the carrier base. Three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

Aspects can include one or more of the following features.

The three or more support structures include at least one support structure that fully surrounds one of the plurality of fabricated structure regions when the wafer is secured to the carrier base.

The plurality of support structures comprise at least one surrounding support structure that fully surrounds all of the plurality of fabricated structure regions when the wafer is secured to the carrier base.

The three or more support structures include at least one interior support structure located within the surrounding support structure.

The interior support structure is located between at least two of the fabricated structure regions, each comprising respective integrated circuits that are identical to each other.

The interior support structure defines at least a portion of a cavity that is connected to a passage configured to provide a flow of air to generate a partial vacuum that secures the wafer to the carrier base.

The plurality of support structures comprise one or more structures defining a cavity in which one of the plurality of fabricated structure regions is contained without making contact with any portion of the carrier base when the wafer is secured to the carrier base.

The cavity is connected to a passage configured to provide a flow of air to generate a partial vacuum that secures the wafer to the carrier base.

The apparatus further comprises a portion of a clamping structure configured to contact the second side of the wafer when the wafer is secured to the carrier base.

The three or more support structures include at least one protruding structure configured to be at least partially inserted into an indentation on the first side of the wafer when the wafer is secured to the carrier base.

The three or more support structures include at least one indentation configured to receive a protruding structure on the first side of the wafer that is at least partially inserted into the indentation when the wafer is secured to the carrier base.

At least two of the fabricated structure regions comprise respective integrated circuits that are identical to each other.

For at least one of the support structures, the location on the first side of the wafer that is between at least two of the plurality of fabricated structure regions overlaps with a point at which respective corners of four different integrated circuit dies intersect.

The alignment features comprise at least three structures configured to contact an edge on a perimeter of the wafer when the wafer is secured to the carrier base.

In another aspect, in general, a method for securing a wafer in a wafer carrier, the wafer having a first side comprising a plurality of fabricated structure regions and a second side that has at least one region that is exposed for fabrication when the wafer is secured, comprises: aligning the wafer to a carrier base configured to receive the wafer based at least in part on one or more alignment features on the carrier base; and contacting the wafer to the carrier base at a plurality of support structures arranged on the carrier base, where three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

Aspects can include one or more of the following features.

The aligning includes translating the wafer in three dimensions and rotating the wafer about at least two axes.

The plurality of support structures comprise at least one surrounding support structure that fully surrounds all of the plurality of fabricated structure regions when the wafer is secured to the carrier base.

In another aspect, in general, a method for fabricating a wafer carrier configured to secure a wafer, the wafer having a first side comprising a plurality of fabricated structure regions and a second side that has at least one region that is exposed for fabrication when the wafer is secured, comprises: forming a carrier base configured to receive the wafer, the carrier base comprising one or more alignment features for aligning the wafer to the carrier base; and forming a plurality of support structures arranged on the carrier base, where three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

Aspects can include one or more of the following features.

Forming the plurality of support structures is based at least in part on information specifying locations of the plurality of fabricated structure regions.

The plurality of support structures comprise at least one surrounding support structure that fully surrounds all of the plurality of fabricated structure regions when the wafer is secured to the carrier base.

Aspects can have one or more of the following advantages.

Among other things, the techniques described herein are an enabler for the implementation of wafer-level heterogeneous integration using TSVs (through-silicon vias). In some examples of photonic integrated circuit (PIC) development, the PIC serves as both a photonic chip and a carrier/interposer for its attached amplifier. Signals move through the PIC using TSVs and reach bottom-side copper pillars attached to the substrate (e.g., PCB, laminate, ceramic). This 3D integration allows for more compactness than some wire bonded assemblies while ensuring proper signal integrity for high-speed operation.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

To leverage 3D packaging with chip-on-wafer design, it is useful to have through-silicon vias (TSVs) that route signals to the bottom-side bumps of the chip. To connect both sides of the wafer that has TSVs, contacts on both sides can be used, which typically protrude beyond the surface of the chip. These structures may comprise a variety of potential fabricated structures with varying topography, which include, for example, copper pillars, solder bumps, and under bump metallurgy (UBM). Furthermore, the wafers that have gone through TSV formation processes typically will be thinned down in the range of 30-200 μm, possibly rendering the wafers very fragile. Thus, with a very thin wafer populated on both sides with protruding structures, it is useful to have a carrier that will support this wafer throughout the whole process flow before being singulated (diced) into individual chips (or dies). With the chips or dies being still part of the whole wafer before it is diced, preserving the topography of the fabricated structure regions (i.e., the dies or regions within the dies) can pose a challenge for the wafer carrier.

Figure 1A:
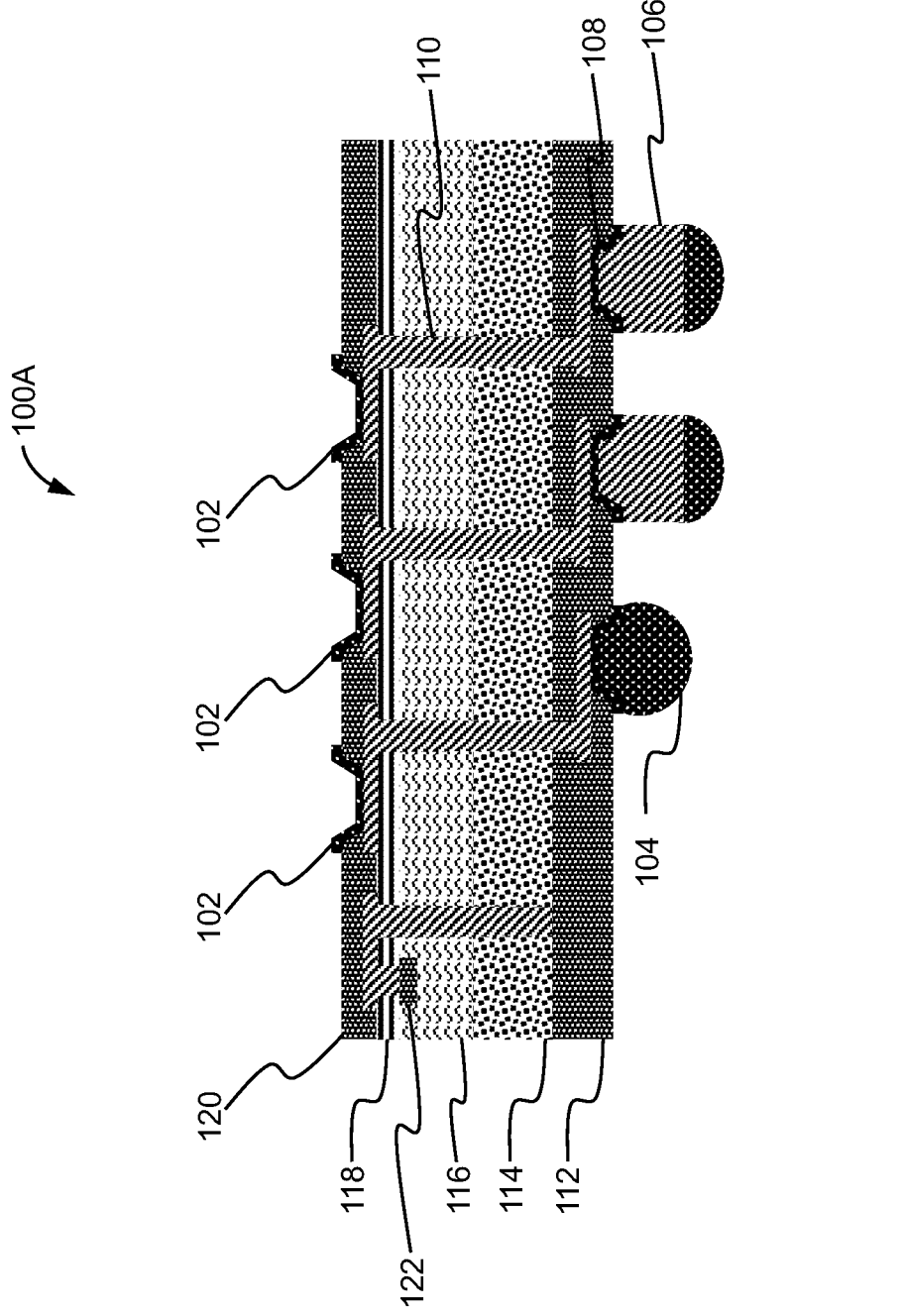
FIGS. 1A and 1B are schematic diagrams of an example wafer.

FIG. 1A shows a schematic diagram of a portion of an example wafer 100A. The wafer 100A comprises companion chip pads 102 along a top surface, as well as solder balls 104 and copper pillars 106 attached to underside pads 108 along a bottom surface. TSVs 110 (through-silicon vias) provide electrical connections, together with the underside pads 108, between respective pairs of companion chip pads 102 and solder balls 104 or copper pillars 106. The wafer 100A comprises various layers (e.g., one or more $SiO_2$ buried oxide (BOX) layers, dielectric layers, and/or passivation layers). In this example, the layers in the wafer 100A include a dielectric layer 112, a silicon layer 114, an $SiO_2$ layer 116, an $SiO_2$ layer 118, and a dielectric layer 120. The dielectric layers can include, for example, a photo-imageable material, typically polyimide, or low temperature cure polyimide, or benzocyclobutene (BCB). The wafer 100A may comprise passive (e.g., waveguides) or active (e.g., photodetectors) optical elements, for example, a first optical element 122.

On photonic wafers, there are optical features that may increase the fragility of the wafers. In some examples, optical coupling structures may comprise physical trenches (also referred to as notches or (etched) wafer cavities) to expose the side optical facets of the chips that are fabricated prior to chip singulation at the wafer level. These various structures, combined with thinned down wafers, can prohibit any stress or bending during wafer handling and removal from carriers. Thus, it is useful to reduce the stress applied by the carrier and to facilitate removal of these potentially fragile wafers without breaking them.

Figure 1B:
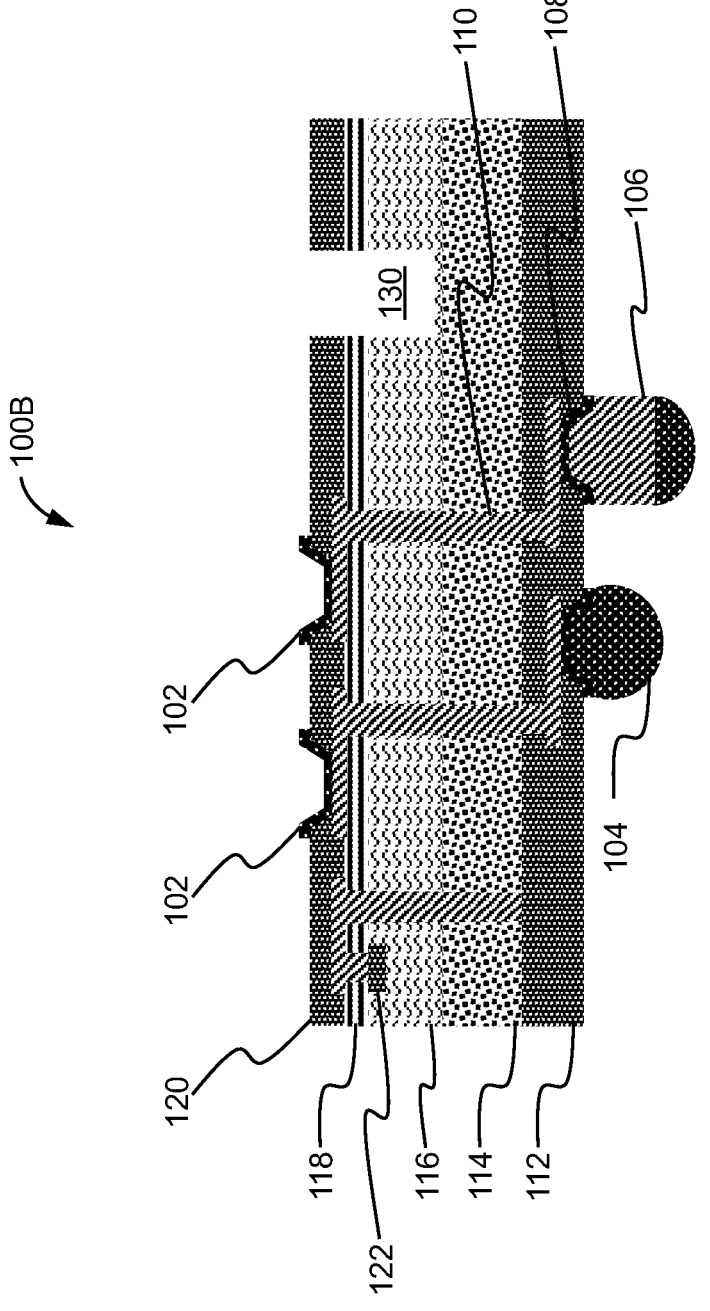

FIG. 1B. shows a schematic diagram of a portion of an example wafer 100B. The wafer 100B comprises a trench 130. The addition of one or more trenches 130 may allow additional optical functionalities of the wafer 100B, although they may also render the wafter 100B more fragile.

During the process flow, there is a specific usefulness associated with the solder of the bumps (e.g., solder balls (C4) or copper pillars) at the bottom side of the wafer. When attaching chips or another wafer on the top side of the host wafer, it may be useful to reach an elevated temperature to achieve a proper bonding. While going through the elevated temperature of the bonding process of the host wafer, the solder on the bottom side also goes through the temperature profile (that may exceed 320° C.) and can be damaged, deformed, and/or contaminated if it is deposited with direct contact on any material that may be used to hold it in place.

A rigid wafer carrier can be formed based on the bottom topography constraints of wafers that are to be fabricated, where the wafer carrier uses recesses (also referred to as cavities or carrier cavities) on the surface of its carrier base to accommodate the bottom topography. In some implementations, its construction resists heat and can use hard clamping of the wafer and/or soft vacuum clamping to secure the wafer onto the carrier base. Certain alignment methods and/or features (e.g., wafer alignment methods, specially arranged indentations) can be used to properly align the carrier cavities with the wafer fabricated structure regions.

The carrier can be configured to include various features, including for example, any of the following:

Pockets in the rigid carrier that can accommodate most wafer topography generated in back end of line (BEOL)

processing of wafers and allow further assembly steps to be accomplished on the other side of the wafer.

Usage of various lithography processing techniques to create a precise, re-usable carrier.

The fine self-alignment of the wafer to the carrier using embedded matching indentations made using etch processes (e.g., wet etch).

The etched material can be selected to properly match the material and compatibility of the wafer. The material used to form the carrier can be selected as metal, ceramic, glass, or silicon construction to meet the specific criteria required by the wafer. The specific properties can be chosen, for example, for mitigating cross-contamination, thermal expansion, thermal resistance, or some combination thereof.

Another aspect of some implementations is to combine multiple material systems on the carrier to further improve functionality and/or mitigate any shortcomings of the main carrier material. For example, an additional soft layer made from polyimide can be deposited on a silicon carrier to protect the wafer bottom side from dents and scratches while keeping the heat-resistance.

The processing of the carrier can enable very precise and complex structures to further improve the main functional design. For example, the etching or machining of additional structures can be used to create one or more vacuum or partial-vacuum passages going to one or more recessed cavities in order to provide a low-profile hold-down clamping solution.

In some implementations, the wafer carrier can be made using rigid materials closely matched in CTE to the attached wafer. Examples of materials that would be compatible with typical silicon wafers are Kovar (Fernico), Invar, Copper-Tungsten alloys, silicon crystal (a silicon wafer is a perfect match), borosilicate glass, and aluminum nitride. Other wafer material may require adjusted/other type of material.

Cavities on the wafer carrier surface ensure that the contact points avoid the fragile topography. Cavities can be built, for example, using etch processes for silicon wafers (e.g., DRIE, wet-etch), precision machining, EDM die sinking, precision milling, and photolithography (i.e., additive methods that create cavities by raising the contact points). Cavities can also be built by stacking at least two layers of rigid material. For example, the cavities can be made from a thin stencil attached (e.g., glued, soldered) on the carrier base.

Figure 2:
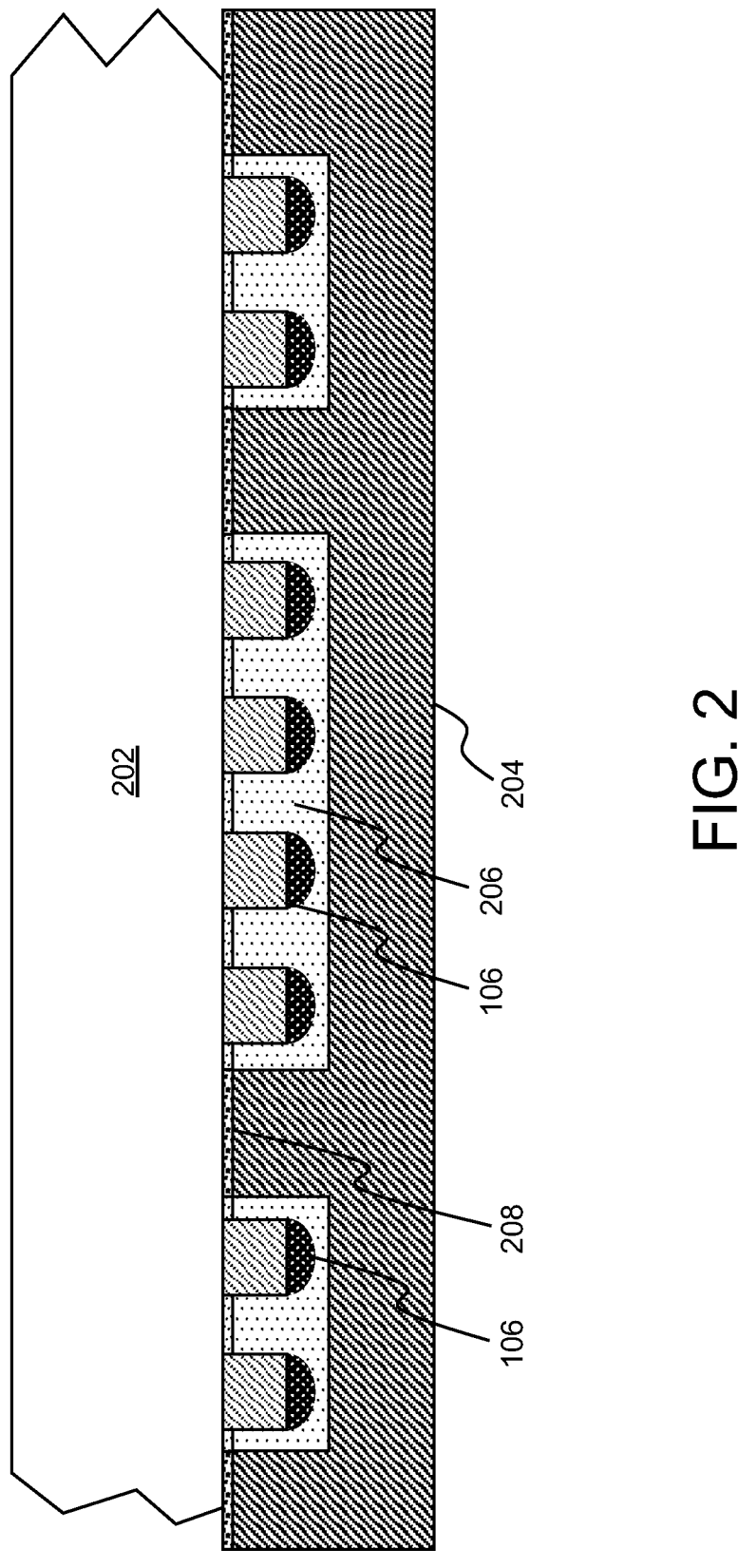
FIGS. 2, 3, and 4 are schematic diagrams of an example carrier base holding a wafer, showing cross-sectional views.

FIG. 2 shows an example wafer 202 secured on a carrier base 204 comprising cavities 206. One or more soft contact materials 208 are used to ensure that the contacting surface between the wafer 202 and the carrier base 204 is relatively soft so as to prevent potentially risky dents and scratches on the bottom side of the wafer 202. The one or more soft contact materials 208 may be chosen to resist reflow temperatures (e.g., polyimide, silicones, gold (soft relative to silicon)).

Figure 3:
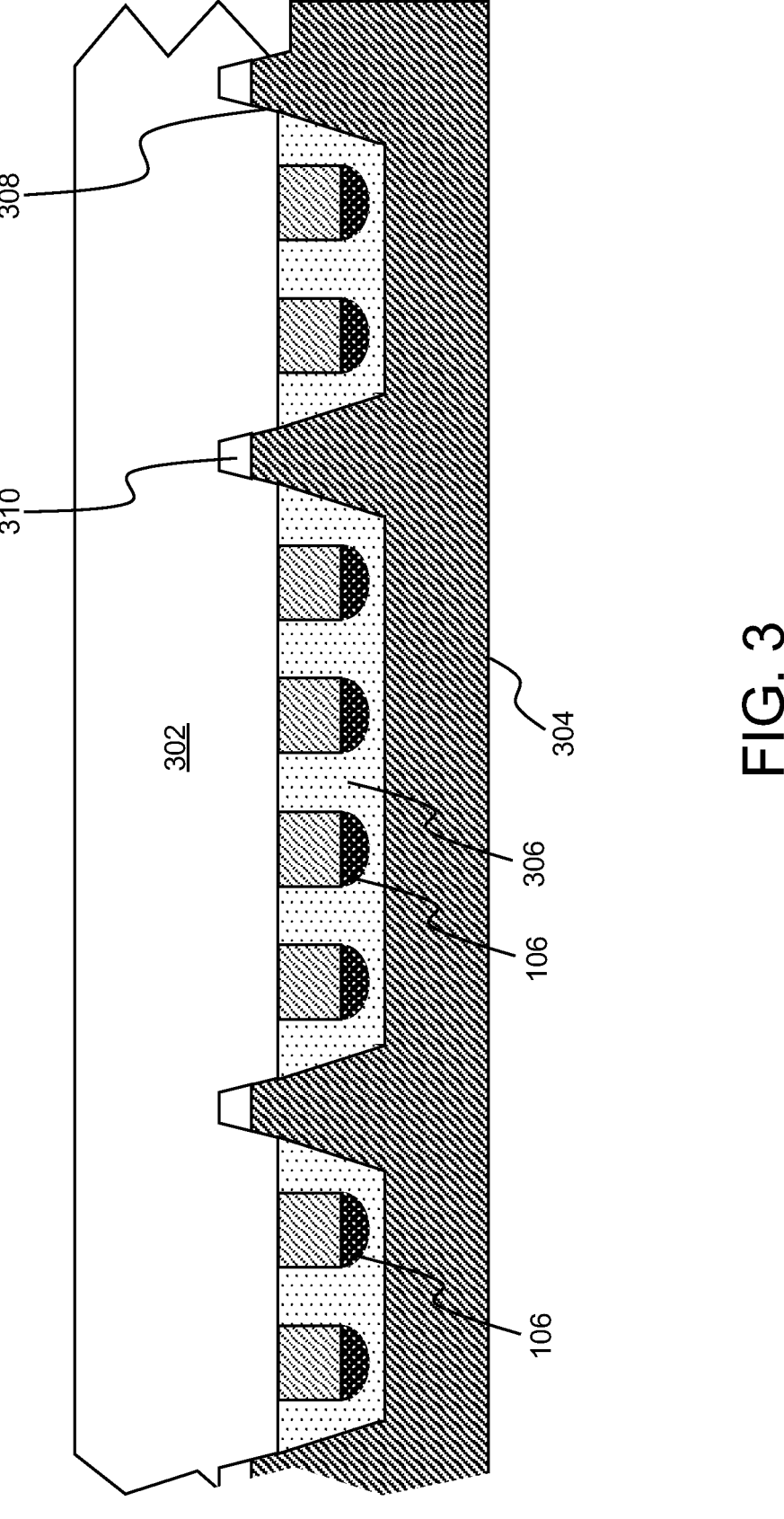

It is possible to align the wafer vertically using hard stops and sufficient clearance of the bumps to the bottom of the cavities. Due to possibly high wafer density, special care may be taken while aligning in the wafer plane to prevent contact between the bottom-side bumps and any hard surface. The number and size of contact surfaces are limited on the wafer, as most areas are covered with bumps. Very small regions, often between dies and near bumps, may be available. Other mechanical alignment methods such as dowel pins and cameras can be coupled with purpose-built indentations in the carrier and the wafer. Such indentations can be made using wet-etch, as shown in FIG. 3, or other substractive and additive methods with sufficient precision. These indentations can provide the final self-alignment of the wafer and carrier when they are inserted in one another, while various methods ensure the rough initial alignment.

FIG. 3 shows an example wafer 302 secured on a carrier base 304 comprising cavities 306 and protrusions 308. The wafer 302 comprises indentations 310 that allow for the insertion of the protrusions 308.

Figure 4:
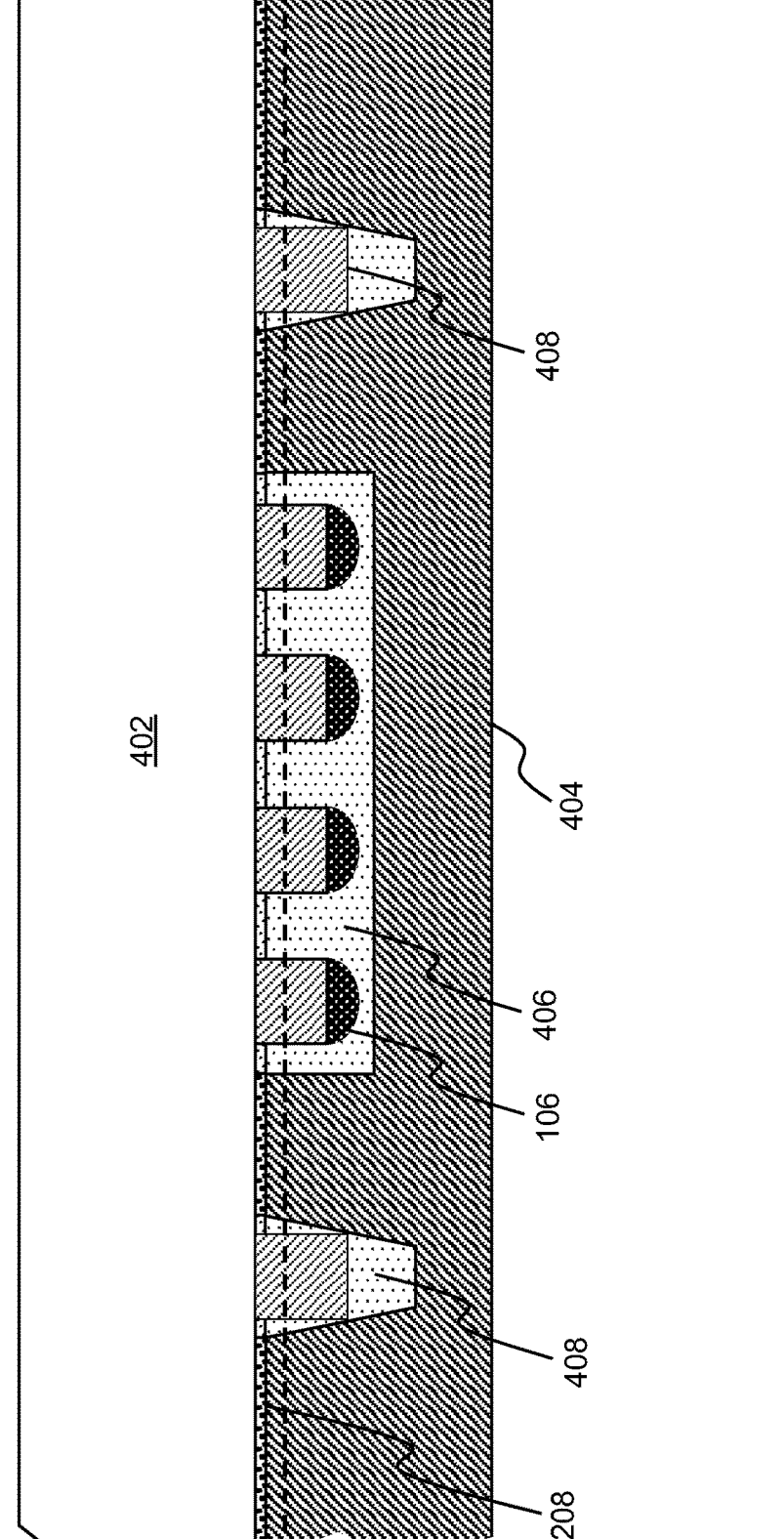

FIG. 4 shows an example wafer 402 secured on a carrier base 404 comprising cavities 406. The wafer 402 comprises sacrificial pillars 408 which can be used with (i.e., inserted into) corresponding cavities 406 on the carrier base 404 (e.g., an etched silicon wafer). The sacrificial pillars 408 may serve a function similar to that of alignment dowel pins, but may allow for a more precise location tolerance due to their co-processing with copper pillars 106. A plane 410 denotes the cross-section used in FIGS. 5C and 5D.

Figures 5A, 5B:
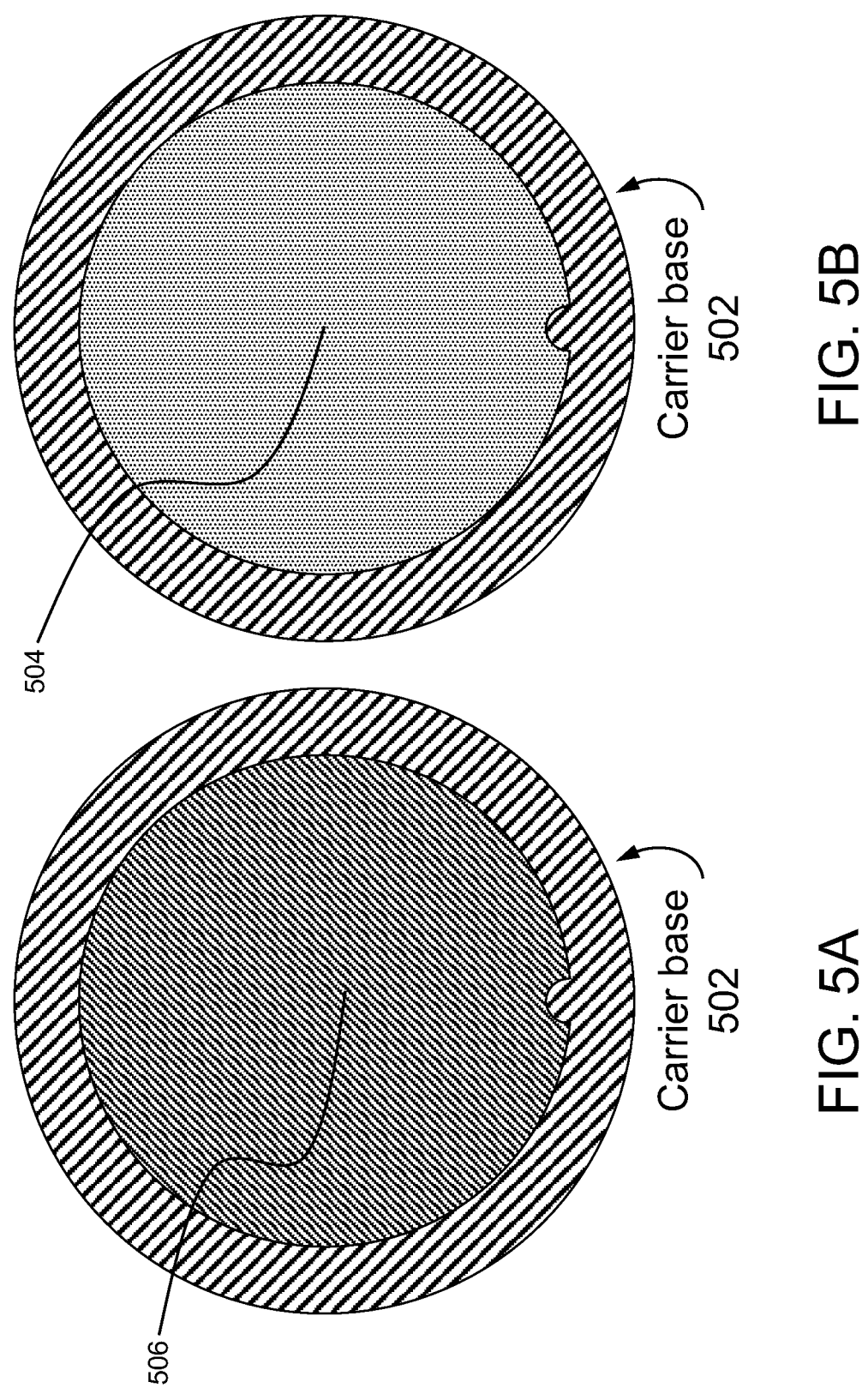
FIGS. 5A and 5B are schematic diagrams of an example carrier base, without and with a wafer, respectively, showing a cross-sectional top view.

FIG. 5A shows a carrier base 502, and FIG. 5B shows the carrier base 502 with a wafer 504, viewed from above. The view of the carrier base in FIG. 5A shows an etched region 506 of the carrier base 502 configured for receiving the wafer 504 as shown in FIG. 5B. Peripheral alignment of the wafer 504 with the carrier base 502 may be performed using an oversized wafer with a notch or other alignment feature (which could be any other shape, including flat, depending on the wafer). The carrier base 502 could also have the same diameter but with a slight offset, giving it a crescent shape (a spring load could be used to keep the wafer pressed on the crescent).

Figures 5C, 5D:
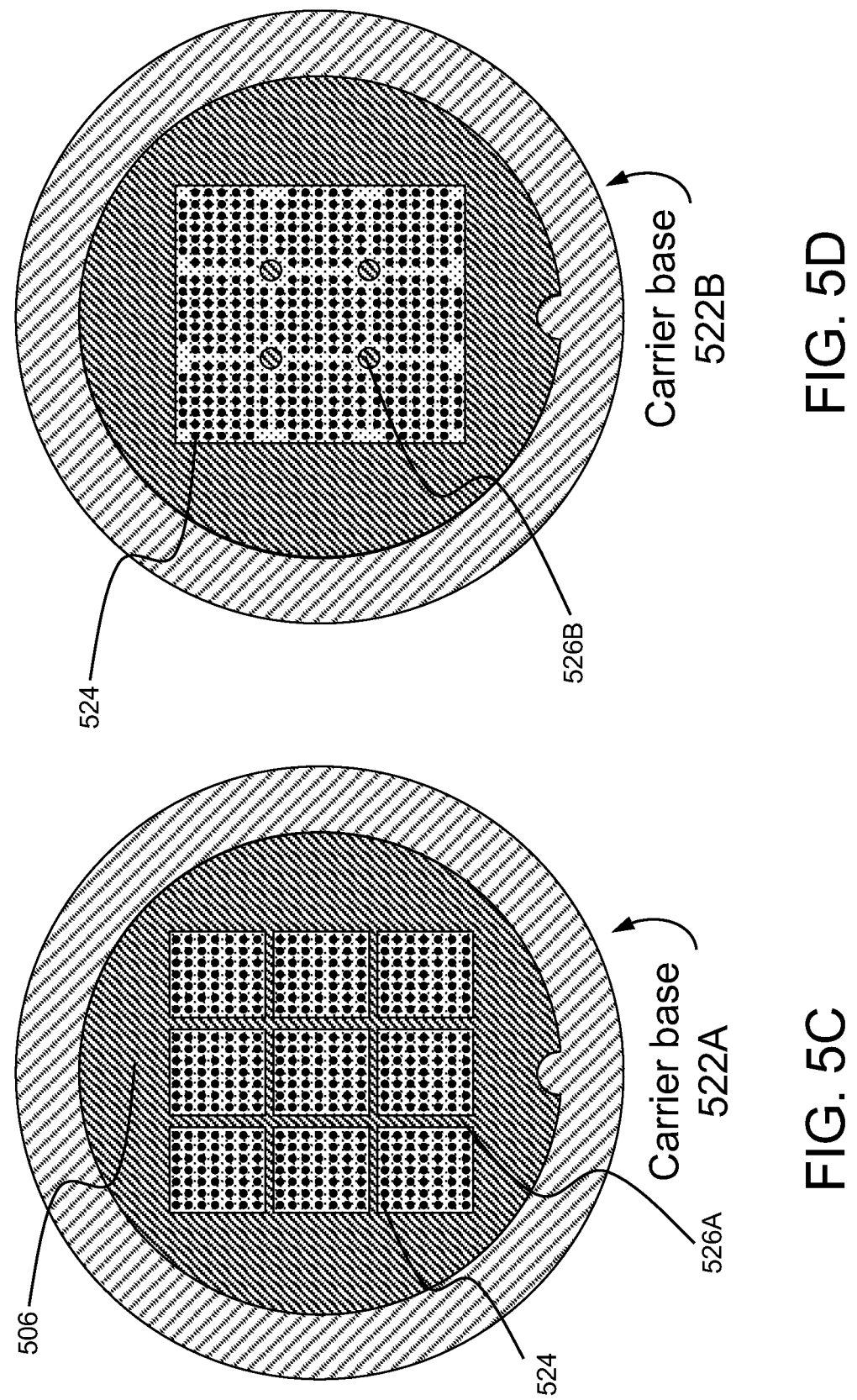
FIGS. 5C and 5D are schematic diagrams of example carrier bases with support structures, showing a cross-sectional top view.

FIGS. 5C and 5D show two example carrier bases with support structures, viewed cross-sectionally (e.g., along the plane 410 of FIG. 4) from above. A first carrier base 522A shows a first set of support structures 526A that can surround die regions 524. A second carrier base 522B shows a second set of support structures 526B that are arranged in regions between die regions 524 (e.g., corners).

Clamping of the wafer to the carrier base can be managed by various mechanical methods, such as a circular clamp around the periphery of the wafer.

Figure 6:
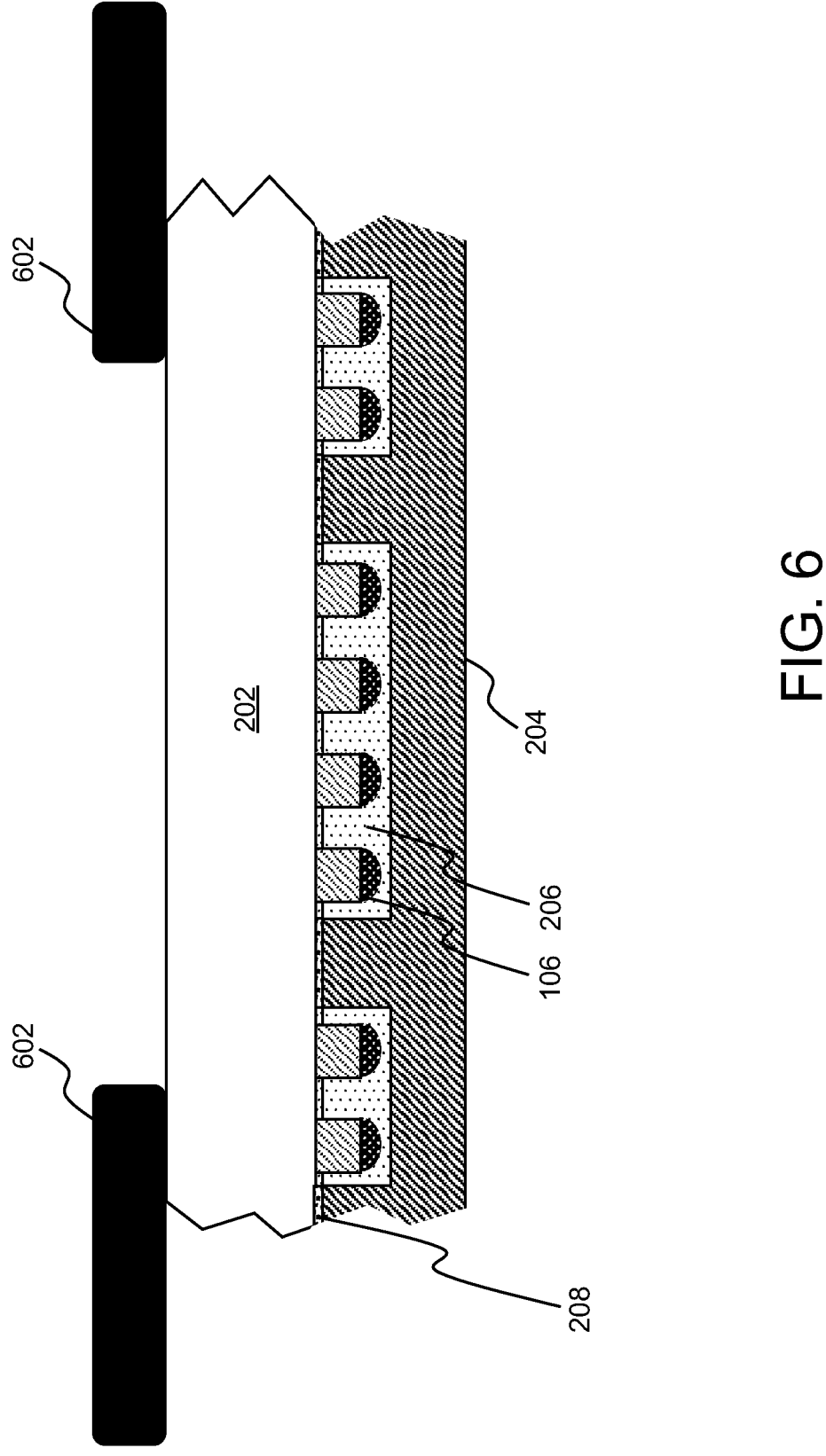
FIGS. 6 and 7 are schematic diagrams of example arrangements for securing a wafer to a carrier base.

FIG. 6 shows an example securing arrangement for a wafer 202. Clamps 602 secure the wafer 202 against a carrier base 204.

Another securing method uses vacuum or partial vacuum to hold down the wafer, possibly for space-saving purposes since mechanical clamps can be in the way of the machines.

Figure 7:
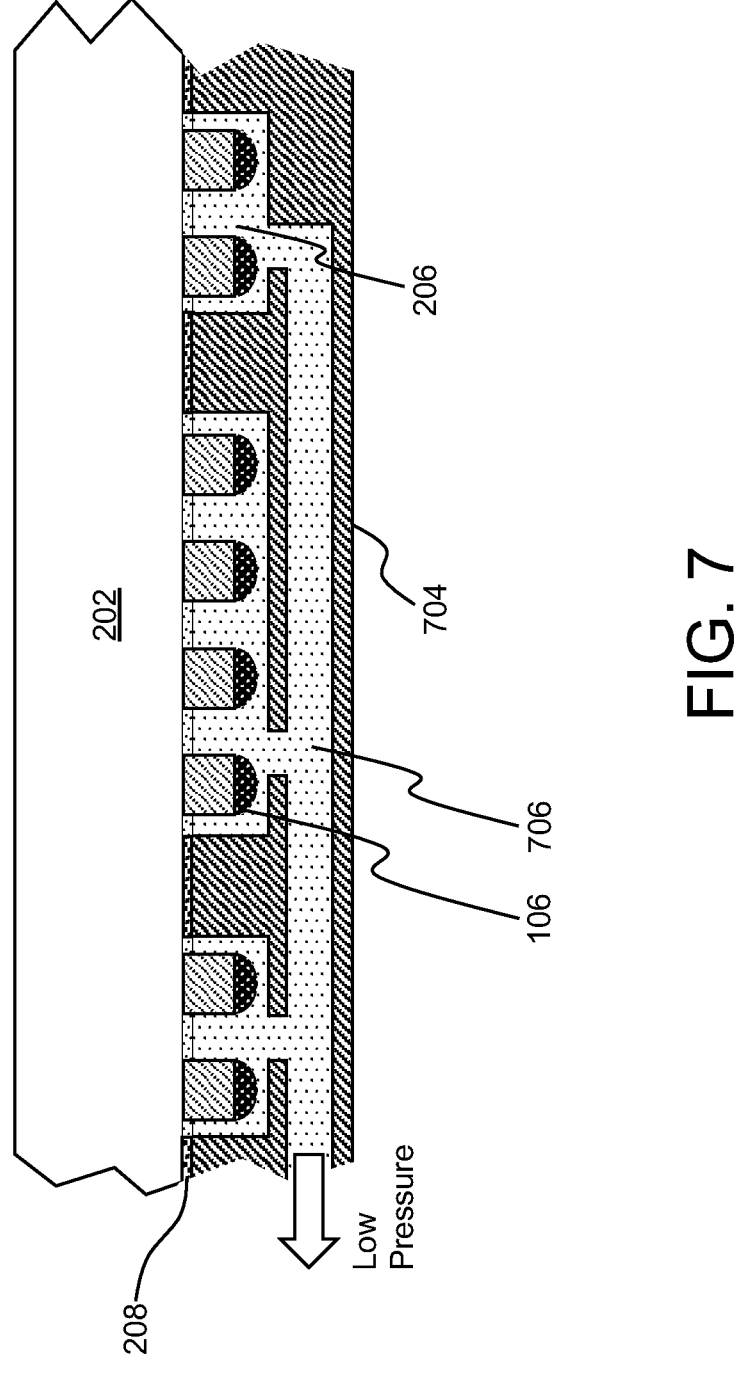

FIG. 7 shows an example securing arrangement for a wafer 202. A carrier base 704 comprises a vacuum channel 706 connected by passages to one or more cavities 206 defined by support structures. The difference between the atmospheric pressure and the partial vacuum of the pockets may create a more uniform clamping force on the wafer 202. Vacuum holding can be provided throughout the fabrication processes on any or all stations used during fabrication, or only on selected stations where the mechanical clamps are removed temporarily.

Figure 8A:
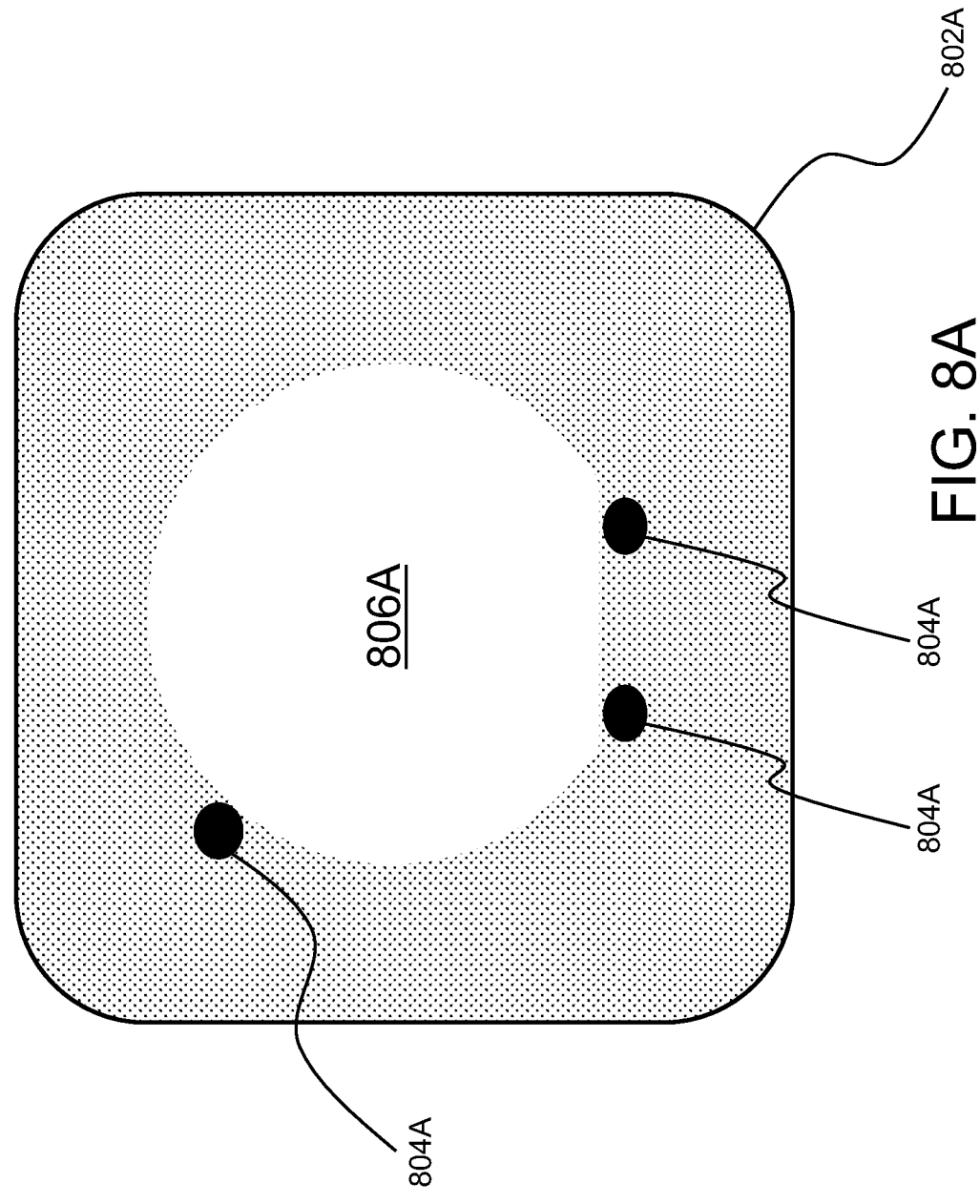
FIGS. 8A and 8B are schematic diagrams of example carrier bases with alignment features.

FIG. 8A shows a first carrier base 802A with a first set of locating pins 804A used as alignment features. A flat-bottomed wafer 806A is in contact with two of the first set of locating pins 804A.

Figure 8B:
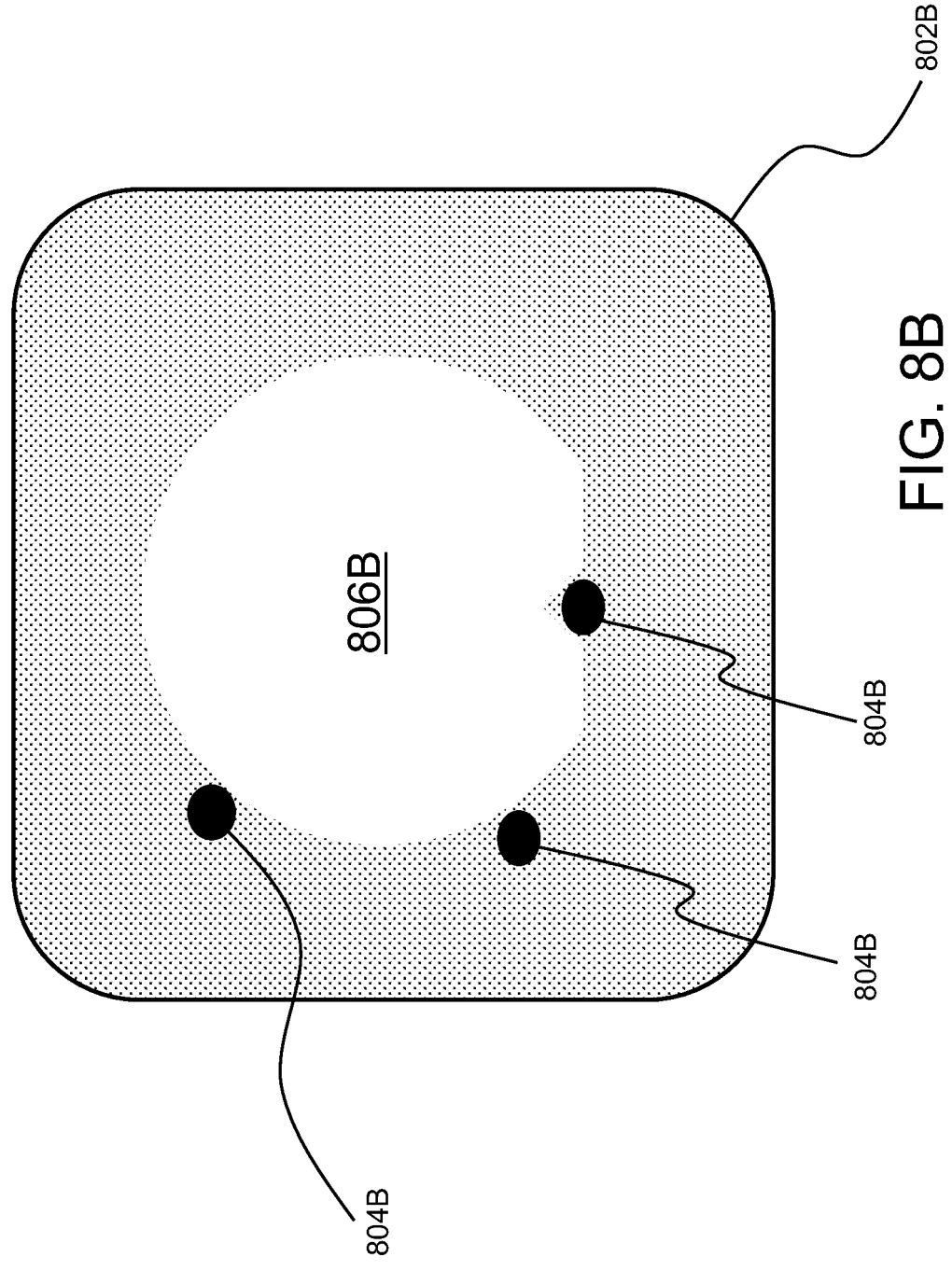

FIG. 8B shows a second carrier base 802B with a second set of locating pins 804B used as alignment features. A v-grooved wafer 806B is in contact with one of the second set of locating pins 804B.

In one aspect, in general, an apparatus for securing a wafer, the wafer having a first side comprising a plurality of fabricated structure regions and a second side that has at least one region that is exposed for fabrication when the wafer is secured, comprises: a carrier base configured to receive the wafer, the carrier base comprising one or more alignment features for aligning the wafer to the carrier base; and a plurality of support structures arranged on the carrier base. Three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

Aspects can include one or more of the following features.

The three or more support structures include at least one support structure that fully surrounds one of the plurality of fabricated structure regions when the wafer is secured to the carrier base.

The plurality of support structures comprise at least one surrounding support structure that fully surrounds all of the plurality of fabricated structure regions when the wafer is secured to the carrier base.

The three or more support structures include at least one interior support structure located within the surrounding support structure.

The interior support structure is located between at least two of the fabricated structure regions, each comprising respective integrated circuits that are identical to each other.

The interior support structure defines at least a portion of a cavity that is connected to a passage configured to provide a flow of air to generate a partial vacuum that secures the wafer to the carrier base.

The plurality of support structures comprise one or more structures defining a cavity in which one of the plurality of fabricated structure regions is contained without making contact with any portion of the carrier base when the wafer is secured to the carrier base.

The cavity is connected to a passage configured to provide a flow of air to generate a partial vacuum that secures the wafer to the carrier base.

The apparatus further comprises a portion of a clamping structure configured to contact the second side of the wafer when the wafer is secured to the carrier base.

The three or more support structures include at least one protruding structure configured to be at least partially inserted into an indentation on the first side of the wafer when the wafer is secured to the carrier base.

The three or more support structures include at least one indentation configured to receive a protruding structure on the first side of the wafer that is at least partially inserted into the indentation when the wafer is secured to the carrier base.

At least two of the fabricated structure regions comprise respective integrated circuits that are identical to each other.

For at least one of the support structures, the location on the first side of the wafer that is between at least two of the plurality of fabricated structure regions overlaps with a point at which respective corners of four different integrated circuit dies intersect.

The alignment features comprise at least three structures configured to contact an edge on a perimeter of the wafer when the wafer is secured to the carrier base.

In another aspect, in general, a method for securing a wafer in a wafer carrier, the wafer having a first side comprising a plurality of fabricated structure regions and a second side that has at least one region that is exposed for fabrication when the wafer is secured, comprises: aligning the wafer to a carrier base configured to receive the wafer based at least in part on one or more alignment features on the carrier base; and contacting the wafer to the carrier base at a plurality of support structures arranged on the carrier base, where three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

Aspects can include one or more of the following features.

The aligning includes translating the wafer in three dimensions and rotating the wafer about at least two axes.

The plurality of support structures comprise at least one surrounding support structure that fully surrounds all of the plurality of fabricated structure regions when the wafer is secured to the carrier base.

In another aspect, in general, a method for fabricating a wafer carrier configured to secure a wafer, the wafer having a first side comprising a plurality of fabricated structure regions and a second side that has at least one region that is exposed for fabrication when the wafer is secured, comprises: forming a carrier base configured to receive the wafer, the carrier base comprising one or more alignment features for aligning the wafer to the carrier base; and forming a plurality of support structures arranged on the carrier base, where three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

Aspects can include one or more of the following features.

Forming the plurality of support structures is based at least in part on information specifying locations of the plurality of fabricated structure regions.

The plurality of support structures comprise at least one surrounding support structure that fully surrounds all of the plurality of fabricated structure regions when the wafer is secured to the carrier base.

While the disclosure has been described in connection with certain embodiments, it is to be understood that the disclosure is not to be limited to the explicitly disclosed embodiments but, on the contrary, is intended to cover various modifications and equivalent embodiments.

What is claimed is:

1. An apparatus comprising:
   a wafer having a first side comprising a plurality of fabricated structure regions and a second side that has at least one region that is exposed for fabrication when the wafer is secured by the apparatus, where the fabricated structure regions include one or more structures that protrude beyond the first side;
   a carrier base configured to receive the wafer, the carrier base comprising one or more alignment features for aligning the wafer to the carrier base; and
   a plurality of support structures arranged on the carrier base, where three or more of the support structures are each
      configured to contact the first side of the wafer when the wafer is secured to the carrier base, and
      arranged on the carrier base to contact the first side of the wafer at a location on the first side of the wafer that is between at least two of the plurality of fabricated structure regions.

2. The apparatus of claim 1, where the three or more support structures include at least one support structure that fully surrounds one of the plurality of fabricated structure regions when the wafer is secured to the carrier base.

3. The apparatus of claim 1, where the plurality of support structures comprise at least one surrounding support structure that fully surrounds all of the plurality of fabricated structure regions when the wafer is secured to the carrier base.

4. The apparatus of claim 3, where the three or more support structures include at least one interior support structure located within the surrounding support structure.

5. The apparatus of claim 4, where the interior support structure is located between at least two of the fabricated structure regions, each comprising respective integrated circuits that are identical to each other.

6. The apparatus of claim 4, where the interior support structure defines at least a portion of a cavity that is connected to a passage configured to provide a flow of air to generate a partial vacuum that secures the wafer to the carrier base.

7. The apparatus of claim 1, where the plurality of support structures comprise one or more structures defining a cavity in which one of the plurality of fabricated structure regions is contained without making contact with any portion of the carrier base when the wafer is secured to the carrier base.

8. The apparatus of claim 7, where the cavity is connected to a passage configured to provide a flow of air to generate a partial vacuum that secures the wafer to the carrier base.

9. The apparatus of claim 1, further comprising a portion of a clamping structure configured to contact the second side of the wafer when the wafer is secured to the carrier base.

10. The apparatus of claim 1, where the three or more support structures include at least one protruding structure configured to be at least partially inserted into an indentation on the first side of the wafer when the wafer is secured to the carrier base.

11. The apparatus of claim 1, where the three or more support structures include at least one indentation configured to receive a protruding structure on the first side of the wafer that is at least partially inserted into the indentation when the wafer is secured to the carrier base.

12. The apparatus of claim 1, where at least two of the fabricated structure regions comprise respective integrated circuits that are identical to each other.

13. The apparatus of claim 1, where, for at least one of the support structures, the location on the first side of the wafer that is between at least two of the plurality of fabricated structure regions overlaps with a point at which respective corners of four different integrated circuit dies intersect.

14. The apparatus of claim 1, where the alignment features comprise at least three structures configured to contact an edge on a perimeter of the wafer when the wafer is secured to the carrier base.

15. A method for securing a wafer in a wafer carrier, the wafer having a first side comprising a plurality of fabricated structure regions and a second side that has at least one region that is exposed for fabrication when the wafer is secured, the method comprising:

aligning the wafer to a carrier base configured to receive the wafer based at least in part on one or more alignment features on the carrier base; and contacting the wafer to the carrier base at a plurality of support structures arranged on the carrier base, where three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

16. The method of claim 15, where the aligning includes translating the wafer in three dimensions and rotating the wafer about at least two axes.

17. The method of claim 15, where the plurality of support structures comprise at least one surrounding support structure that fully surrounds all of the plurality of fabricated structure regions when the wafer is secured to the carrier base.

18. A method for fabricating a wafer carrier configured to secure a wafer, the wafer having a first side comprising a plurality of fabricated structure regions and a second side that has at least one region that is exposed for fabrication when the wafer is secured, the method comprising:

forming a carrier base configured to receive the wafer, the carrier base comprising one or more alignment features for aligning the wafer to the carrier base; and forming a plurality of support structures arranged on the carrier base, where three or more of the support structures are each configured to contact the first side of the wafer when the wafer is secured to the carrier base, and arranged on the carrier base to contact the first side of the wafer at a location on the first side of the wafer that is between at least two of the plurality of fabricated structure regions.

19. The method of claim 18, where forming the plurality of support structures is based at least in part on information specifying locations of the plurality of fabricated structure regions.

20. The method of claim 18, where the plurality of support structures comprise at least one surrounding support structure that fully surrounds all of the plurality of fabricated structure regions when the wafer is secured to the carrier base.

* * * * *